United States Patent
Heinrich et al.

(10) Patent No.: US 6,189,203 B1
(45) Date of Patent: Feb. 20, 2001

(54) METHOD OF MANUFACTURING A SURFACE MOUNTABLE POWER SUPPLY MODULE

(75) Inventors: Randy T. Heinrich, Dallas; Allen F. Rozman, Richardson; Thang D. Truong, Grand Prairie; William L. Woods, Jr., Kaufman, all of TX (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/288,750

(22) Filed: Apr. 8, 1999

(51) Int. Cl.[7] ....................................................... H01F 41/06
(52) U.S. Cl. ............................... 29/606; 29/602.1; 29/830
(58) Field of Search ................................... 29/602.1, 606, 29/830; 361/704, 705, 707, 712, 717–719, 736, 752

(56) References Cited

U.S. PATENT DOCUMENTS 5,588,848  12/1996  Law et al. ............................... 439/83

OTHER PUBLICATIONS

"DC/DC Modules for Low Voltage Applications" by Bogdan Brakus; 1998 IEEE; pp. 392–397.

Primary Examiner—Carl E. Hall

(57) ABSTRACT

A surface mountable power supply and a method of manufacturing the power supply. In one embodiment, the power supply includes: (1) a substrate having opposing upper and lower conductive layers (2) a lower electrical component having a first lead mounted on a first pad on the lower conductive layer and subject to forces capable of detaching the lower electrical component from the substrate when the power supply passes through a reflow soldering process, (3) an upper electrical component having a second lead mounted on a second pad on the upper conductive layer, (4) a solder located proximate the first lead, the lower electrical component of a sufficiently low weight such that a surface tension of a liquid state of the solder is sufficient to maintain the lower electrical component in contact with the lower conductive layer as the power supply passes through the reflow soldering process, (5) a planar magnetic device mounted on the substrate, the planar magnetic device having windings formed from a portion of conductive traces on the upper and lower conductive layers and a core disposed through apertures of the substrate and proximate the windings and (6) an inter-substrate conductive mount, coupled to the lower conductive layer, composed of a material having a melting point above a solder reflow temperature and adapted to mount the power supply to an adjacent substrate and provide a conductive path therebetween, the conductive mount including first and second compliant solder joints at interfaces of the substrate and the adjacent substrate, respectively.

11 Claims, 14 Drawing Sheets

*FIG. 6A*
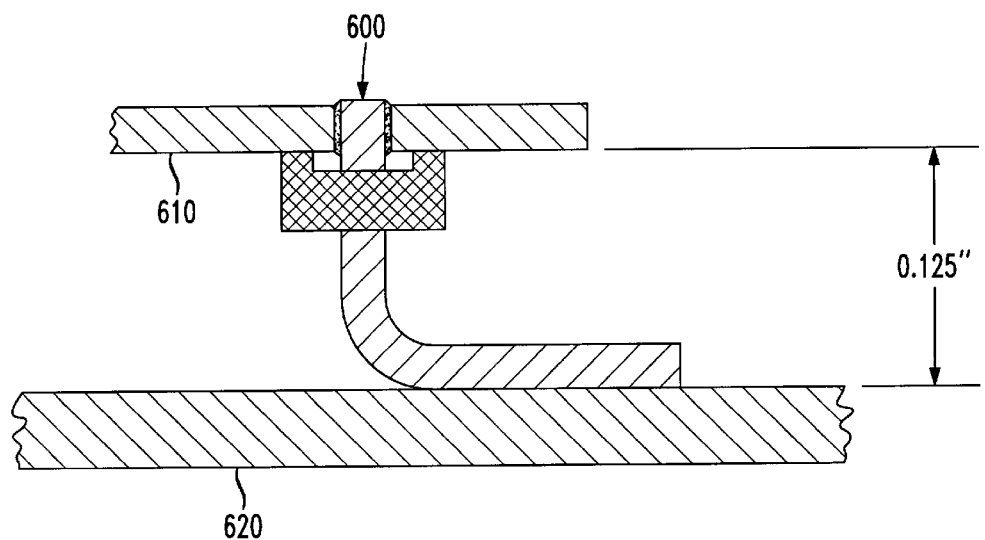
*FIG. 6B*
*FIG. 6C*
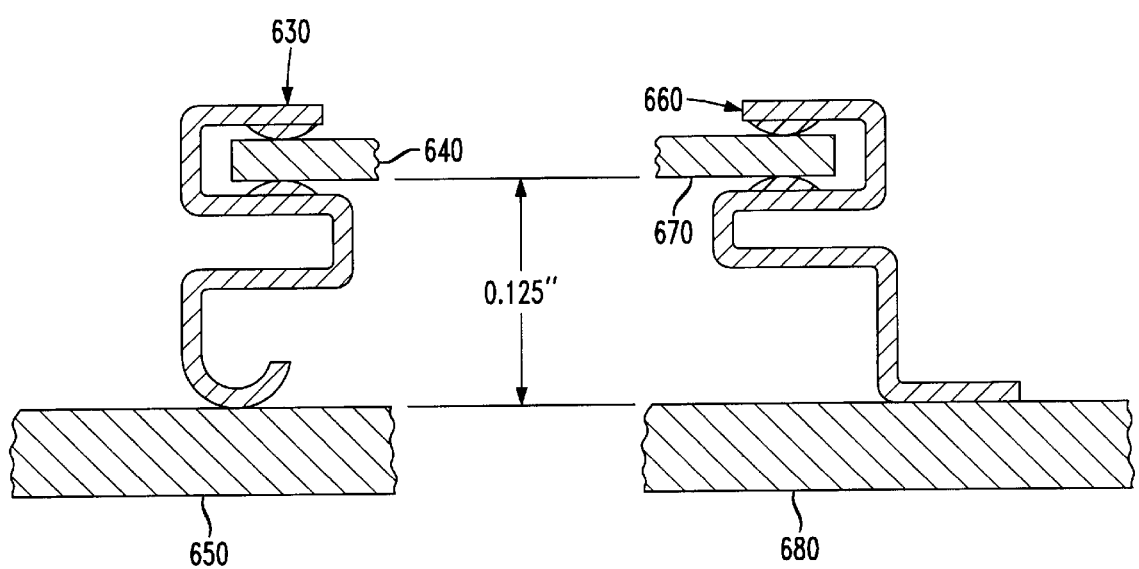

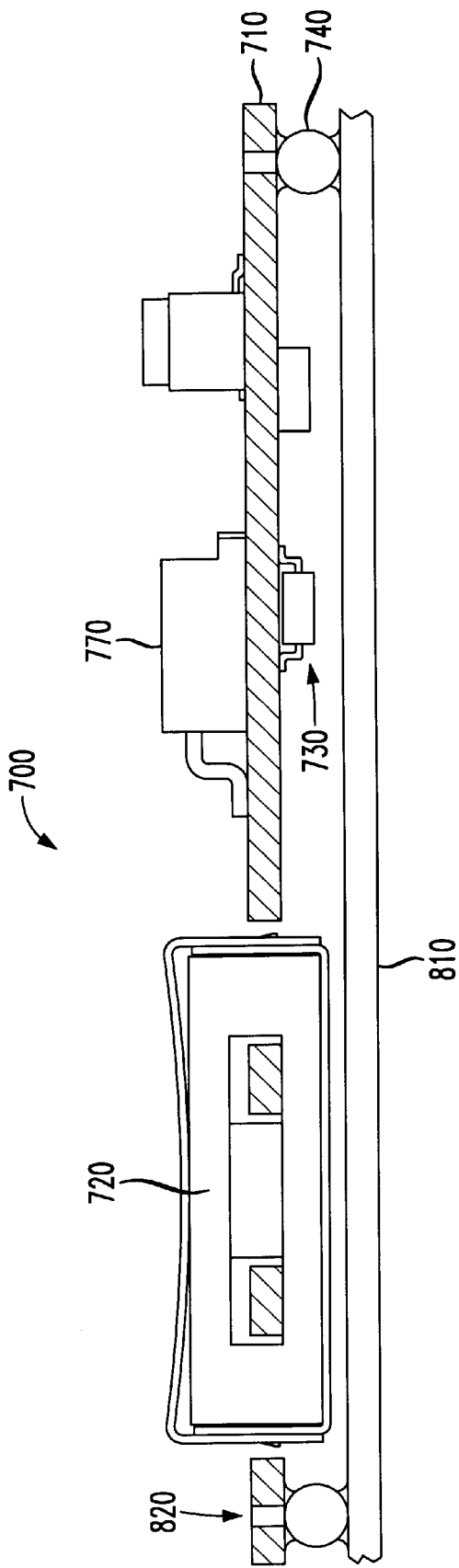

METHOD OF MANUFACTURING A SURFACE MOUNTABLE POWER SUPPLY MODULE

CROSS-REFERENCE TO RELATED APPLICATIONS AND PATENTS

This application is related to the following U.S. patents and applications:

| Reference No. | Title | Inventor(s) | Date |
|---|---|---|---|
| 08/777,342 ('342 application) | Methods of Manufacturing a Power Magnetic Device and Tool for Manufacturing The Same | Roessler, et al. | Filed Dec. 27, 1996 |
| 08/879,478 ('478 application) | Board-Mountable Power Supply Module | Rozman, et al. | Filed June 20, 1997 |
| 08/908,887 ('887 application) | Methods of Manufacturing a Magnetic Device and Tool for Manufacturing the Same | Roessler, et al. | Filed Aug. 8, 1997 |
| 08/940,557 ('557 application) | Power Magnetic Device Employing a Leadless Connection to a Printed Circuit Board and Method of Manufacture Thereof | Pitzele, et al. | Filed Sept. 30, 1997 |
| 08/940,672 ('672 application) | Post-mountable Planar Magnetic Device and Method of Manufacture Thereof | Pitzele, et al. | Filed Sept. 30, 1997 |
| 09/045,217 ('217 application) | Power Magnetic Device Employing a Leadless Connection to a Printed Circuit Board and Method of Manufacture Thereof | Pitzele, et al. | Filed Mar. 20, 1998 |
| 09/126,183 ('183 application) | Encapsulated, Board-mountable Power Supply and Method of Manufacture Therefor | Stevens | Filed July 30, 1 998 |
| 09/184,753 ('753 application) | Lead-free Solder Process for Printed Wiring Boards | Pilukaitis, et al. | Filed Nov. 2, 1998 |
| Heinrich 2-20-3-10–17 | Inter-substrate Conductive Mount For a Circuit Board, Circuit Board and Power Magnetic Device Employing The Same | Heinrich, et al. | Filed April 1999 |
| 5,541,828 ('828 patent) | Multiple Output Converter with Continuous Power Transfer to an Output and with Multiple Output Regulation | Rozman | Issued July 30, 1996 |
| 5,588,848 ('848 patent) | Low inductance surface mount connectors for interconnecting circuit devices and method for using same. | Law, et al. | Issued Dec 31, 1996 |
| 5,724,016 ('016 patent) | Power Magnetic Device Employing a Compression-mounted Lead to a Printed Circuit Board | Roessler, et al. | Issued Mar. 3, 1998 |
| 5,750,935 ('935 patent) | Mounting Device for Attaching a Component Through an Aperture in a Circuit Board | Stevens | Issued May 12, 1998 |
| 5,787,569 ('569 patent) | Encapsulated Package for Power Magnetic Devices and Method of Manufacture Therefor | Lotfi, et al. | Issued Aug. 4, 1998 |
| 5,835,350 ('530 patent) | Encapsulated, Board-mountable Power Supply and Method of Manufacture Therefor | Stevens | Issued Nov. 10, 1998 |

The above-listed applications and patents are commonly assigned with the present invention and are incorporated herein by reference as if reproduced herein in their entirety.

TECHNICAL FIELD OF THE INVENTION

The present invention is directed, in general, to power conversion and, more specifically, to a surface mountable power supply module and a method of manufacturing therefor.

BACKGROUND OF THE INVENTION

The trend in the design of power systems for electronic assemblies has been towards distributed power architectures. A power system with a distributed power architecture may employ many small board mounted power supply modules in place of a few larger and more centralized power supply modules. The power system may be used to power a diverse variety of electronic assemblies, including, for example, a computer work station, a file server or a telecommunications switching system. Each board mounted power module may be conveniently located proximate the electronic circuitry being powered. Often, one or more board mounted power supply modules are located on a circuit card in the electronic assembly. Since real estate on the circuit card is limited, minimizing the size of the power supply modules is a continuing goal. By reducing a footprint of the power supply module, real estate on the circuit card previously required by the larger power supply modules may be used for additional circuitry, for instance, to increase the processing throughput of a computer card or to increase the switching capacity of a telecommunications card. Additionally, many electronic assemblies employ a circuit card to circuit card spacing of less than one inch. Minimizing the circuit card to circuit card spacing allows for a denser assembly, which allows the throughput or capacity of the electronic assembly containing the circuit cards to be advantageously increased. A power module having an attribute of a low height profile is also more desirable.

Consequently, the trend in the design of power supply modules has been toward achieving increased output power along with a lower height profile and a smaller footprint area, thereby increasing power density. Improvements in power level, power density or profile, however, cannot be made at the expense of the thermal and electrical characteristics of the overall power supply module and its constituent components.

Conventional power supply modules may be constructed as a unitary, encapsulated package, having one or more rows of leads, with the power supply module enclosed in a metal case. The leads allow the module to be coupled to a circuit card while the metal case contains attachment mounts for an external heat sink. The power supply module often includes one or more power devices (e.g., transistors or diodes) in thermal communication with the metal case, one or more magnetic devices (e.g., transformers or inductors) providing electrical isolation and energy storage and one or more circuit boards containing passive electronic devices to provide, among other things, control and monitoring functions.

Power devices and magnetic devices that require thermal management due to their high power dissipation may be mounted on a metal circuit board employing insulated metal substrate technology, for example, a THERMAL CLAD substrate manufactured by the Bergquist Corporation of Minneapolis, Minn. Electronic devices such as passive devices that do not require thermal management may be mounted on either the metal circuit board or on a conventional FR4 circuit board. The FR4 circuit board may then be mechanically and electrically coupled to the metal circuit board to facilitate electrical communication and power flow between the various parts of the power supply module.

The leads of the power supply module are mechanically and electrically coupled to either the FR4 circuit board or the metal circuit board. The power supply module is typically encapsulated in a plastic or metal case that is filled with an encapsulant to protect the internal components of the power supply module from contaminants and perhaps to improve heat flow between the internal components and the case.

The aforementioned encapsulated package design, however, suffers from a number of deficiencies. At least two circuit boards, the metal circuit board and the FR4 circuit board, are required to accommodate the constituent components of the power supply module. Employing multiple circuit boards increases both complexity and cost of the power supply module. Further, the encapsulated package design is not readily mass producible, for example, with conventional pick and place equipment.

A power supply module employing the encapsulated package design is often coupled to a heat sink that dissipates some of the heat generated by the power and magnetic devices. There are applications, however, where the heat sink is not required due to the power supply module's lower power dissipation. Other applications may require a power supply module having a lower height profile than is available with conventional encapsulated package power supply modules. An open frame design is typically employed in these applications. An example of an open frame power supply module is the HW100 series manufactured by Lucent Technologies of Mesquite, Tex. (Lucent). An open frame power supply module typically includes a number of electronic devices mounted on a single FR4 circuit board. The leads of the power supply module are mechanically and electrically coupled to the FR4 circuit board to allow the power supply module to mount to the end user's circuit card.

Conventional encapsulated and open frame power supply modules are often mounted to the end user's circuit card via through-hole pins. The leads of the power supply modules are typically soldered to the circuit card manually. Lucent's JW150 series or HW100 series board mounted power supplies (BMP's) are examples of through-hole mounted power supply modules. An end user's circuit card typically contains a large number of surface mount components. In fact, the power supply module is often the only through-hole mounted component on the circuit card. A separate or additional manufacturing step is thus required to mount the power supply module to the circuit card, thereby increasing the complexity and overall cost of the electronic assembly incorporating the circuit card. Therefore, it would be advantageous to provide a power supply module capable of being surface mounted to the circuit card using the same reflow soldering process used to mount the other components.

One difficulty with the surface mount approach lies in the need for the power supply module to pass through the reflow soldering process as it is mounted to the end user's circuit card. The reflow soldering process can subject the power supply module to extreme stresses, possibly melting all of the power supply module's internal solder joints and possibly degrading the functionality of the constituent components of the power supply module [e.g., the equivalent series resistance (ESR) of tantalum capacitors]. The electronic devices of the power supply module may shift or even decouple from the FR4 circuit board during the reflow soldering process, possibly destroying the functionality of the power supply module.

Efforts to alleviate the stresses caused by the reflow soldering process have often centered on the use of high temperature solder for the power supply module's internal solder joints. The end user's reflow temperature profile may be set to a temperature that is sufficient to melt the solder between the power supply module and the circuit card, but is too low to melt the high temperature internal solder joints. This may require special processing techniques and materials, such as employing lead-free solder and lead-free component plating to ensure high reliability. The '753 application describes a lead-free solder process that improves the reliability of solder joints that may be subjected to the reflow soldering process. Also, it may be necessary to secure heavier components using glue or other mechanical fasteners to ensure that the components remain in place during the reflow soldering process. Clearly, employing glue or additional mechanical fasteners will add cost and complexity to the overall assembly.

Accordingly, what is needed in the art is a surface mountable power supply that overcomes the deficiencies of the prior art.

SUMMARY OF THE INVENTION

To address the above-discussed deficiencies of the prior art, the present invention provides a surface mountable power supply and a method of manufacturing the power supply. In one embodiment, the power supply includes: (1) a substrate having opposing upper and lower conductive layers (2) a lower electrical component having a first lead mounted on a first pad on the lower conductive layer and subject to forces capable of detaching the lower electrical component from the substrate when the power supply passes through a reflow soldering process, (3) an upper electrical component having a second lead mounted on a second pad on the upper conductive layer, (4) a solder located proximate the first lead, the lower electrical component of a sufficiently low weight such that a surface tension of a liquid state of the solder is sufficient to maintain the lower electrical component in contact with the lower conductive layer as the power supply passes through the reflow soldering process, (5) a planar magnetic device mounted on the substrate, the planar magnetic device having windings formed from a portion of conductive traces on the upper and lower conductive layers and a core disposed through apertures of the substrate and proximate the windings and (6) an inter-substrate conductive mount, coupled to the lower conductive layer, composed of a material having a melting point above a solder reflow temperature and adapted to mount the power supply to an adjacent substrate and provide a conductive path therebetween, the conductive mount including first and second compliant solder joints at interfaces of the substrate and the adjacent substrate, respectively.

The present invention, in one aspect, introduces the broad concept of an open frame, surface mountable power supply wherein the lower conductive layer of a substrate of the power supply contains surface mount electrical components of a sufficiently low weight such that a surface tension of a liquid state of the solder is sufficient to maintain the components in contact with the lower conductive layer as the power supply passes through a reflow soldering process. Larger components, such as power or magnetic devices that are too large to be held in place by the surface tension of the solder alone, are primarily placed on the upper conductive layer. The larger components are thus prevented from becoming detached from the substrate of the power supply as the power supply passes through the reflow soldering process. The power module may, therefore, be advantageously constructed using a standard tin/lead (60/40 or 63/37 Sn/Pb) solder composition, thus obviating the need for a higher temperature solder composition or the use of glue or other mechanical attachments to hold most of the larger or heavier components in place. The power supply may also be constructed with inter-substrate conductive mounts having two compliant solder joints. The compliant solder joints cooperate with the conductive mounts to improve the co-planarity of the power supply during the reflow soldering process.

In one embodiment of the present invention, the substrate is selected from the group consisting of an epoxy-glass substrate, a paper phenolic substrate, and an insulated metal substrate. In a preferred embodiment, the substrate is an FR4 substrate. Those skilled in the art are familiar with a variety of substrate materials that may be employed with the present invention.

In one embodiment of the present invention, the solder is a tin/lead solder composition. The solder, therefore, will transition to a liquid state as the power supply passes through the reflow soldering process. In a related embodiment, the tin/lead solder composition is selected from the group consisting of a 60/40 Sn/Pb composition and a 63/37 Sn/Pb composition. The present invention may advantageously avoid the use of high temperature, lead-free solder, although such materials may be readily employed as required by a particular application.

In one embodiment of the present invention, the inter-substrate conductive mount is selected from the group consisting of a hollow tin/lead plated copper ball, a solid ball composed of high temperature solder and a solid metal ball. Of course, the conductive mount may be of any geometry, including any substantially spherical, cylindrical or toroidal shape. Alternatively, the conductive mount may have a substantially cubical or rectangular shape. In a related embodiment, the conductive mount is of a sufficiently low weight such that a surface tension of the liquid state of the solder is sufficient to maintain the conductive mount in contact with the lower conductive layer as the power supply passes through the reflow soldering process.

In one embodiment of the present invention, the power supply further includes an auxiliary substrate, surface mounted to the substrate of the power supply. The auxiliary substrate advantageously provides additional real estate for constituent components of the power supply, thereby increasing a power density of the power supply. In a related embodiment, a material of the auxiliary substrate is substantially similar to a material of the main substrate of the power supply. Using similar or identical materials for both the main and auxiliary substrates allow the difference in thermal coefficients of expansion between the substrates to be minimized.

In one embodiment of the present invention, the power supply further includes a heat sink surface mounted to the upper conductive layer. The heat sink assists in removing heat dissipated by the power supply.

In one embodiment of the present invention, the inter-substrate conductive mount is compatible with a through-hole mounting hole on the adjacent substrate. The inter-substrate conductive mount may thus enable the power supply to be mounted to the adjacent substrate via the through-hole mounting hole.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form. dr

BRIEF DESCRIPTION OF THE DRAWINGS

For a more complete understanding of the present invention, reference is now made to the following descriptions taken in conjunction with the accompanying drawings, in which:

FIGS. 6A, 6B and 6C illustrate side cut away views of a variety of inter-substrate conductive mounts for a power supply constructed in accordance with the principles of the present invention;

FIG. 8 illustrates a side cut away view of the power supply of FIG. 7;

DETAILED DESCRIPTION

Figure 1:
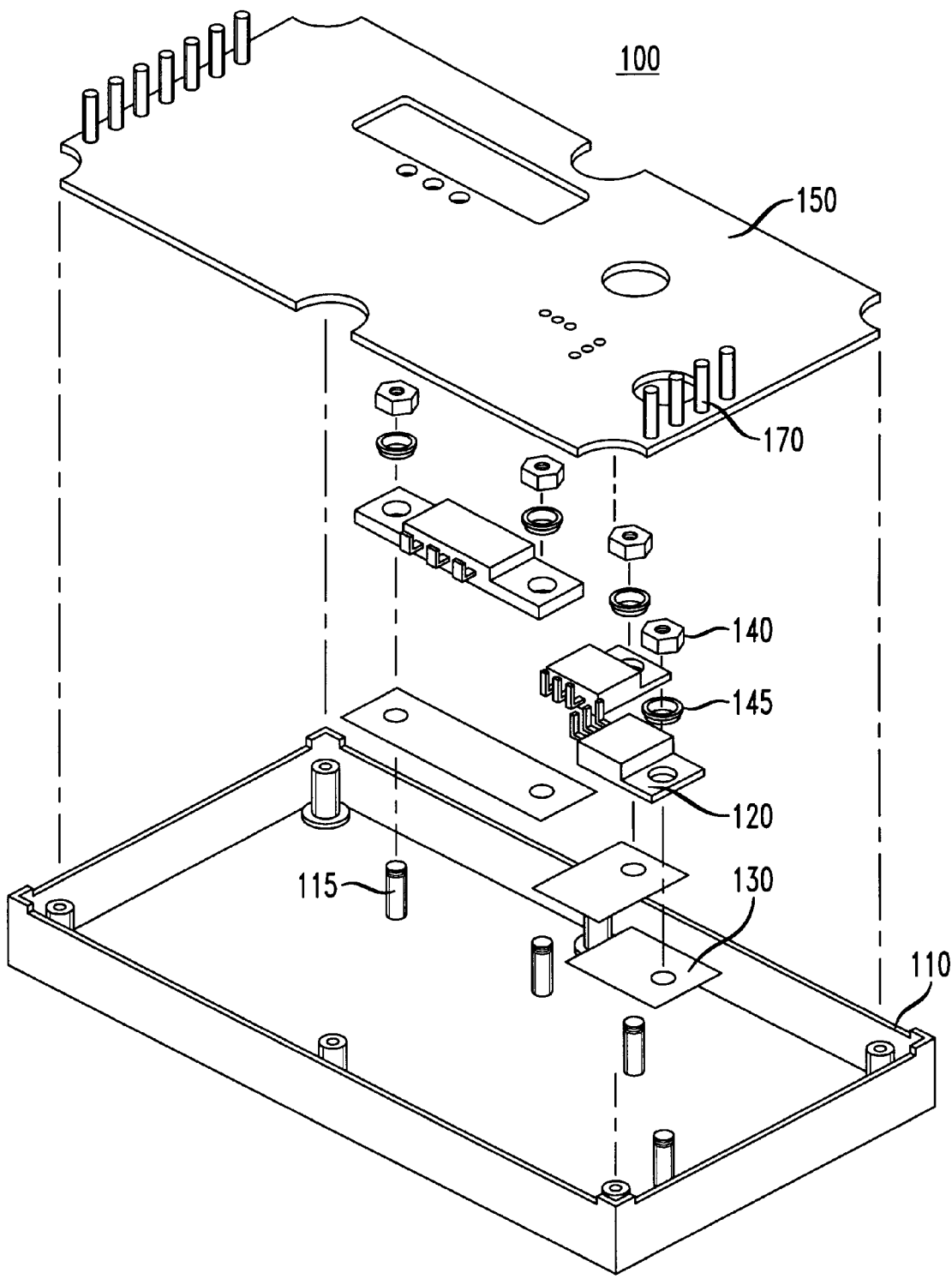
FIG. 1 illustrates an exploded isometric view of a prior art power supply.

Referring initially to FIG. 1, illustrated is an exploded isometric view of a prior art power supply 100. The power supply 100 includes a metal case 110 having a plurality of fasteners thereon (one of which is designated 115). The power supply 100 also includes a plurality of semiconductor power devices (one of which is designated 120) coupled to the metal case 110 (via the fasteners 115) through a plurality of insulators (one of which is designated 130) by a plurality of nuts and washers (one pair of which is designated as 140, 145). The insulators 130 provide both electrical isolation and thermal conductivity between the power devices 120 and the metal case 110. While the metal case 110 does not contain conductors and therefore does not electrically interconnect the power devices 120, the metal case 110 may assist in thermal management of the power devices 120.

The power supply 100 further includes a conventional FR4 circuit board 150 having a plurality of magnetic and other electronic devices mounted thereon. The power supply 100 still further includes a plurality of leads (one of which is designated 170) for connection to an end user's circuit card. The leads 170 of the power supply 100 are designed for through-hole mounting on the end user's circuit card. While through-hole mounting is acceptable for some applications, many users would prefer a surface mountable power supply that can be placed on the circuit card and reflowed along with the other components on the circuit card.

In the illustrated embodiment, the power devices 120 are mounted to the fasteners 115 with nuts and washers 140, 145. The power devices 120 are, therefore, not subject to displacement, even if the power supply 100 were subjected to the reflow soldering process. The nuts and washers 140, 145 and corresponding fasteners 115, however, add complexity to the manufacturing of the power supply 100.

Figure 2:
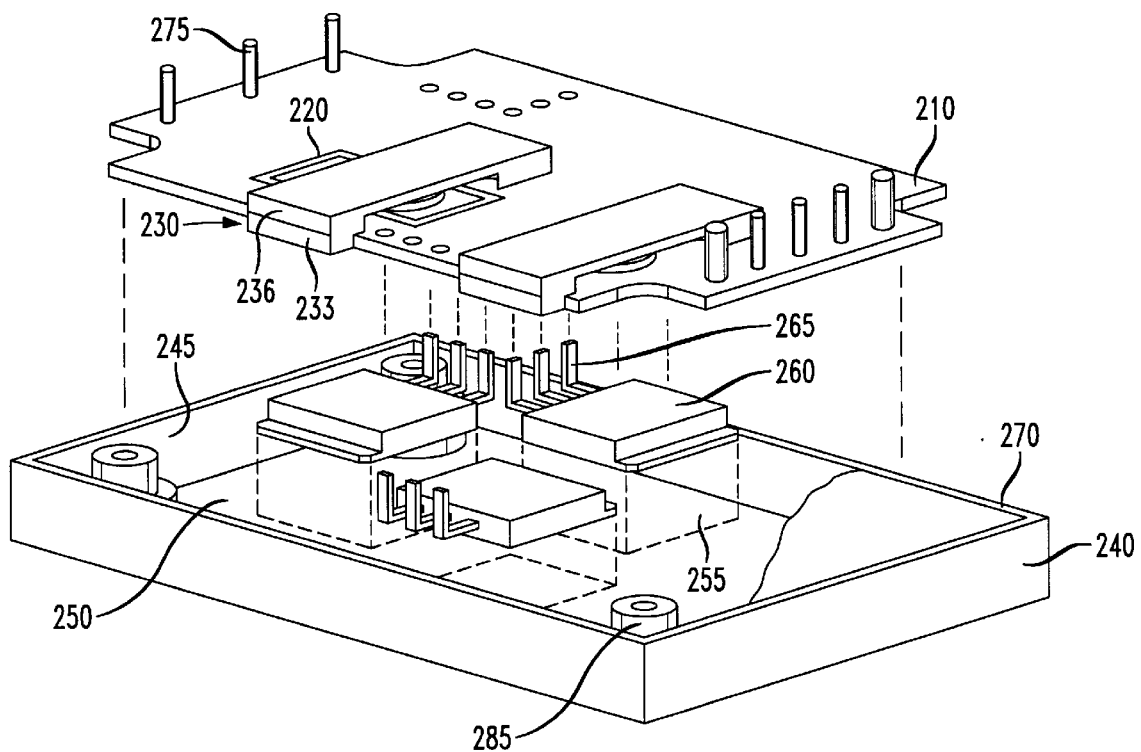
FIG. 2 illustrates an exploded isometric view of another prior art power supply.

Turning now to FIG. 2, illustrated is an exploded isometric view of another prior art power supply 200. The power supply 200 advantageously employs planar magnetic devices (one of which is designated 230) to decrease the size of the power supply 200. The power supply 200 includes a conventional FR4 circuit board 210 containing conductive traces for interconnecting electronic devices mounted thereto. The planar magnetic device 230 has windings 220 formed from a portion of the conductive traces. A core of the planar magnetic device 230 (including first and second core halves 233, 236) is disposed through apertures of the circuit board 210 and proximate the windings 220.

The power supply 200 further includes a metal case 240 having a base and four side walls, thus forming a five-sided reservoir to receive the circuit board 210 therein. Alternatively, the metal case 240 may be formed without one or more of the side walls to allow air flow through the power supply 200. The air flow may advantageously assist in dissipating heat from the constituent components of the power supply 200. In the illustrated embodiment, the metal case 240 is an insulated metal substrate such as a THERMAL CLAD substrate, having an electrically insulating layer 245 and an electrically conductive layer 250, in addition to the metal layer. Portions of the electrically conductive layer 250 may be removed, allowing the remaining portions to form conductive traces for interconnecting the electronic devices. The metal case 240 further has attachment points for coupling to an external heat sink. In the illustrated embodiment, the attachment points are internally threaded posts (one of which is designated 285) protruding from the metal case 240.

The power supply 200 further includes a plurality of semiconductor power devices (e.g., a switching device, one of which is designated 260) having a body coupled in thermal communication with the metal case 240 and terminals (one of which is designated 265) couplable to the conductive traces of the circuit board 210. The power device 260 may be soldered to the metal case 240 via a conductive pad 255, with the solder joint providing thermal coupling between the power device 260 and the metal case 240. Soldering the power device 260 to the metal case 240 enhances an automatic assembly (e.g., for repeatability purposes) of the power supply 200.

The power supply 200 further includes an encapsulant 270, located within the reservoir, that provides a thermally conductive path to direct heat generated by the electrical components of the power supply 200 towards the metal case 240. The encapsulant 270 may be located in only a portion of the reservoir or may substantially fill the reservoir. In either case, the encapsulant 270 secures the components within the power supply 200, allowing the components to resist displacement, even if the power supply 200 were subjected to the reflow soldering process.

Figure 3:
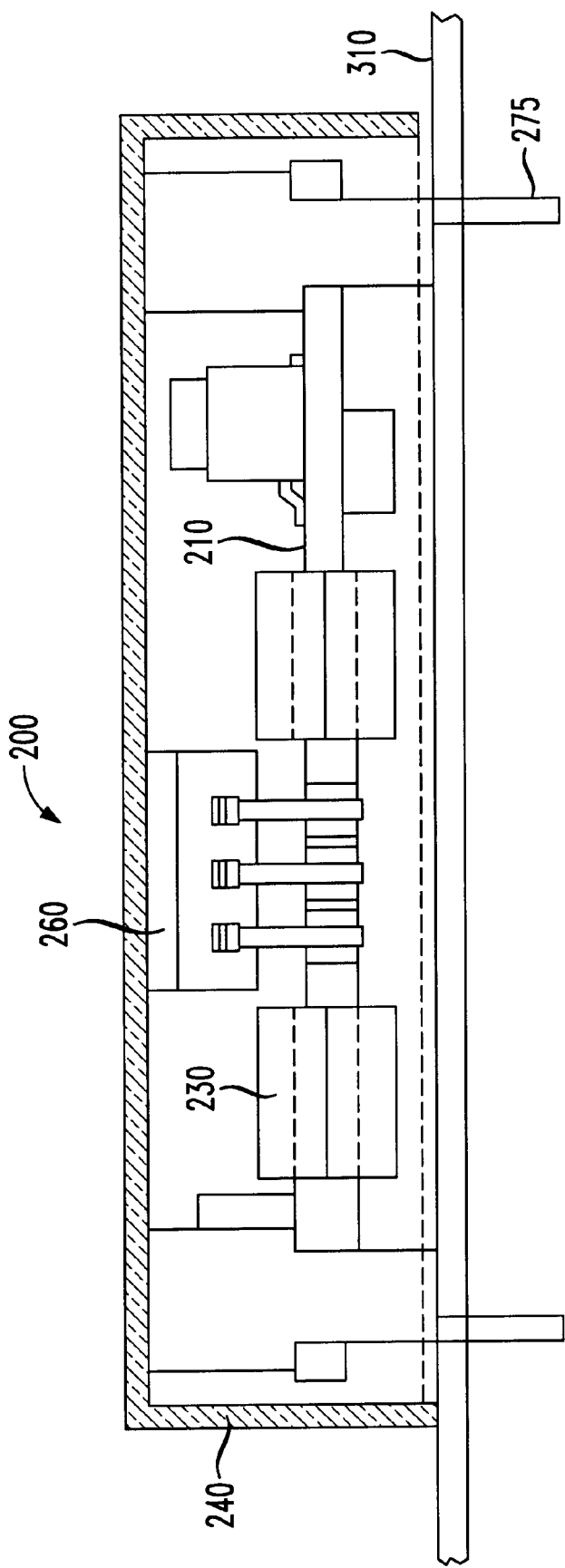
FIG. 3 illustrates a side cut away view of the prior art power supply of FIG. 2 mounted on an end user's circuit card.

Turning now to FIG. 3, illustrated is a side cut away view of the prior art power supply 200 of FIG. 2 mounted on an end user's circuit card 310. The power supply 200 is designed to be through-hole mounted on the end user's circuit card 310 using conventional soldering techniques. Since the end user may subject the circuit card 310 to the reflow soldering process after the power supply 200 has been mounted thereon, it would be advantageous for the power supply 200 to be able to survive the reflow soldering process. The power supply 200, therefore, employs high temperature, lead-free solder. The '753 application describes a lead-free solder process that improves the reliability of solder joints that may be subjected to the reflow soldering process. The end user's reflow temperature profile may then be set to a temperature sufficient to melt the solder between the power supply 200 and the circuit card 310, but not sufficient to melt the high temperature solder joints within the power supply 200. Further, the encapsulant 270 within the power supply 200 ensures that the components remain in place during the reflow soldering process.

While the use of high temperature lead-free solder will allow the power supply 200 to survive the reflow soldering process, the constituent components of the power supply 200 are necessarily subject to high temperatures during the assembly of the power supply 200 as the components are soldered to the circuit board 210. The high temperatures may degrade the functionality of the components or, in extreme cases, cause some of the components to malfunction. Therefore, what is needed in the art is a power supply module that may be manufactured using, for instance, a standard tin/lead (e.g., 60/40 or 63/37 Sn/Pb) solder composition, thus avoiding the disadvantages associated with the use of high temperature lead-free solder.

Figure 4:
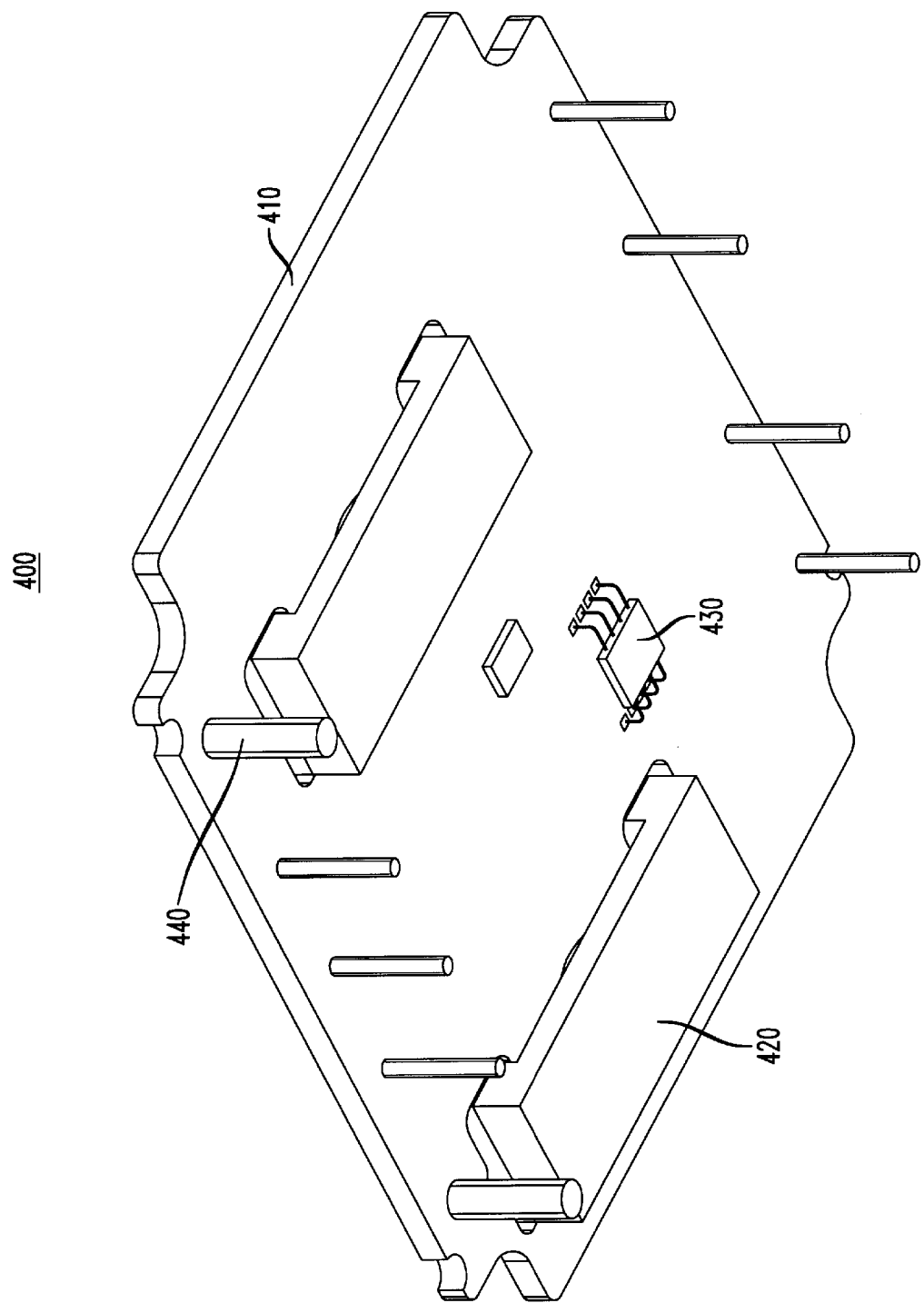
FIG. 4 illustrates an isometric view of an embodiment of a power supply constructed in accordance with the principles of the present invention.

Turning now to FIG. 4, illustrated is an isometric view of an embodiment of a power supply 400 constructed in accordance with the principles of the present invention. The power supply 400 employs an open-frame design and includes a substrate 410 having opposing upper and lower conductive layers. In the illustrated embodiment, the substrate 410 is a conventional epoxy-glass material such as FR4. Those skilled in the art are familiar with a variety of materials that may be employed as the substrate 410, including epoxy-glass (e.g. FR4), paper phenolic and substrates incorporating one or more metal layers. The power supply 400 further includes a number of inter-substrate conductive mounts (one of which is designated 440) coupled to the lower conductive layer. The mounts 440 are adapted to mount the power supply 400 to an end user's circuit card (or an adjacent substrate) and provide a conductive path therebetween.

The power supply 400 further includes a planar magnetic device 420 mounted on the substrate 410. In the illustrated embodiment, the planar magnetic device 420 is a transformer having windings formed from a portion of the conductive traces on the upper and lower layers of the substrate 410. A core of the transformer (including first and second core halves) is disposed through apertures of the substrate 410 and proximate the windings. The first and second core halves are mechanically coupled together to impart the desired magnetic property. There are a variety of devices available for mechanically coupling the first and second core halves, including a clip described by Stevens in the '935 patent and an automated glue process described by Roessler in the '342 and '887 applications.

While the illustrated embodiment of the planar magnetic device 420 has windings formed from the substrate 410 of the power supply 400, other planar magnetic devices may have windings disposed in a separate, smaller substrate. The smaller substrate may then be surface mounted to the substrate 410 of the power supply 400. In the '557 and '217 applications, Pitzele describes a number of planar magnetic devices employing the separate, smaller substrate. Although a wide variety of magnetic devices are employable with the principles of the present invention, the planar magnetic device 420 offers a high degree of design flexibility, allowing the power supply 400 to achieve both a lower overall height profile and a higher conversion efficiency.

The power supply 400 further includes a number of electrical components (not shown) mounted on the upper conductive layer. The power supply 400 further includes a number of electrical components (one of which is designated 430) mounted on the lower conductive layer. In the illustrated embodiment, the electrical components are mounted on the upper and lower conductive layers of the substrate 410 using a standard tin/lead (e.g., 60/40 or 63/37 Sn/Pb) solder composition. The standard tin/lead solder will transition to a liquid state as the power supply 400 is brought to a reflow temperature, subjecting the electrical components 430 to forces capable of detaching the electrical components 430 from the substrate 410.

The power supply 400 of the present invention, therefore, advantageously places small components (e.g., an 0805 resistor package or an S08 package) on the lower conductive layer. For the purposes of the present invention, small components are defined as those having a sufficiently low weight such that a surface tension of the solder is sufficient to maintain the components in contact with the lower conductive layer as the solder is subjected to a temperature (e.g., 220° C.) sufficient to transition it to the liquid state during the reflow soldering process. Larger components, for example, power or magnetic devices (e.g., a $D^2$-pak power MOSFET) that are too large to be held in place by the surface tension of the solder alone, are primarily placed on the upper conductive layer. The power supply 400, therefore, can be directly reflow soldered along with other components on an end user's circuit card. When the power supply 400 passes through the end user's reflow soldering process, many (if not all) of the solder joints of the power supply 400 also reflow. The electrical components advantageously remain in position, however, due to the placement of small components on the lower conductive layer and the larger components on the upper conductive layer. The present invention thus avoids the use of glue or other mechanical fasteners to ensure that the components remain in place during the reflow soldering process. The present invention further avoids the use of high temperature lead-free solder and the disadvantages associated therewith.

Figure 5:
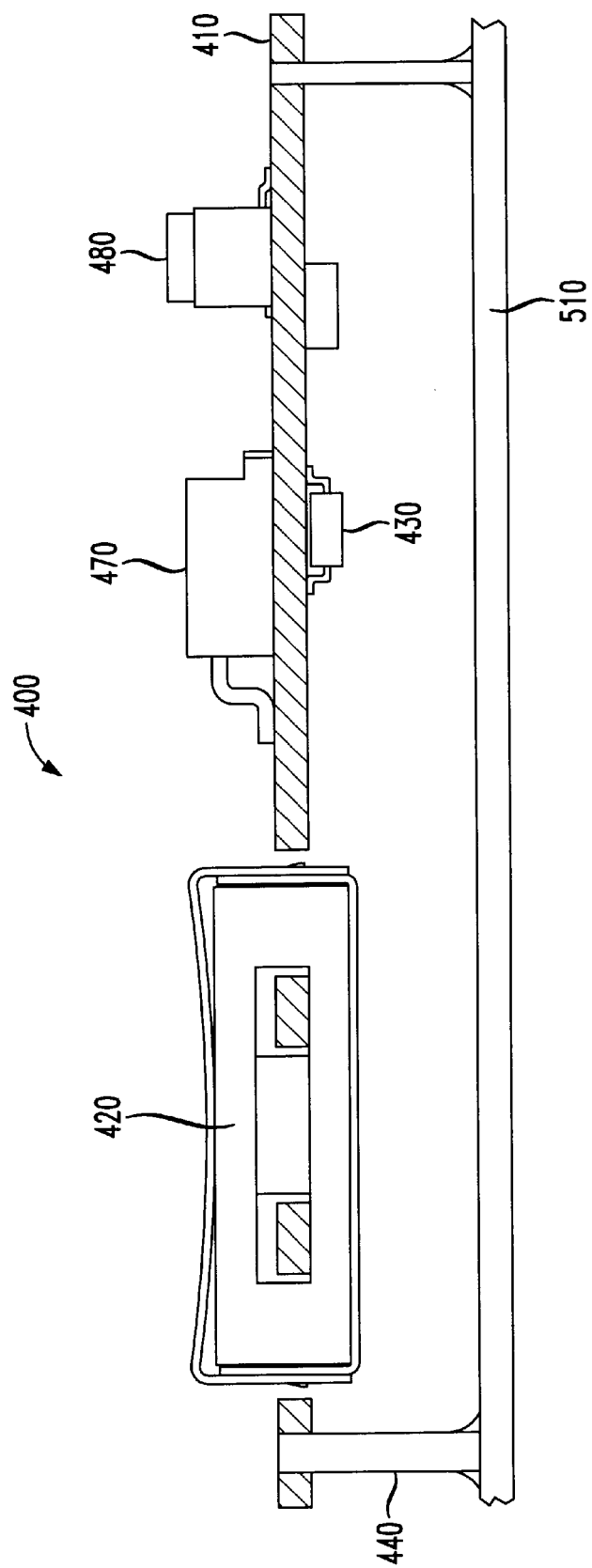
FIG. 5 illustrates a side cut away view of the power supply of FIG. 4 mounted on an end user's circuit card.

Turning now to FIG. 5, illustrated is a side cut away view of the power supply 400 of FIG. 4 mounted on an end user's circuit card 510. Since the power supply 400 is designed to be surface mounted on the end user's circuit card 510 using a reflow soldering process, small components 430 are mounted on the lower conductive layer of the substrate 410 while larger components 470, 480 are advantageously mounted on the upper conductive layer. The small components 430 may thus be maintained in contact with the lower conductive layer by a surface tension of the solder as the power supply 400 is subjected to the reflow soldering process.

In the illustrated embodiment, the inter-substrate conductive mounts 440 of the power supply 400 are pins that are inserted into holes in the substrate 410 and fixedly attached thereto with an interference fit or a solder joint. The conductive mounts 440 are typically mounted to substrate 410. The bottom portion of the conductive mounts 440 are then cut to form a co-planar mounting surface. Once cut, the conductive mounts 440 have a substantially flat end that forms a butt joint between the conductive mounts 440 and the end user's circuit card 510. The power supply 400 may thus be surface mounted to the end user's circuit card 510 using the reflow soldering process. The conductive mounts 440 may be individual pins or, alternatively, may be part of a header assembly. Typically, a number of conductive mounts 440 are required to couple the power and control functions of the power supply 400 to the end user's circuit card 510. The conductive mounts 440, therefore, may be formed into a header assembly as a single device that can advantageously maintain the co-planarity of the conductive mounts 440 with respect to the power supply 400 and the end user's circuit card 510.

Turning now to FIGS. 6A, 6B and 6C, illustrated are side cut away views of a variety of inter-substrate conductive mounts for a power supply constructed in accordance with the principles of the present invention. Referring initially to FIG. 6A, a first conductive mount 600 is a pin that is inserted into a hole in the substrate 610 and fixedly attached thereto with an interference fit, a solder joint or a combination thereof. A bottom portion of the pin 600 is then bent to form a co-planar mounting surface, allowing the power supply to be surface mounted to the end user's circuit card 620 using the reflow soldering process.

Turning now to FIGS. 6B and 6C, second and third conductive mounts 630, 660 are edge mounted to the substrates 640, 670, respectively. In the illustrated embodiments, the second and third conductive mounts 630, 660 are preferably shaped to clamp around an edge of the substrates 640, 670. The second and third conductive mounts 630, 660 may be secured to the substrates 640, 670 with solder as required. Bottom portions of the second and third conductive mounts 630, 660 are then bent to form a co-planar mounting surface for the power supply. More specifically, the bottom portion of the second conductive mount 630 is bent inward to form a J-lead while the bottom portion of the third conductive mount 660 is bent outward and flattened to form a gull-wing lead.

Figure 7:
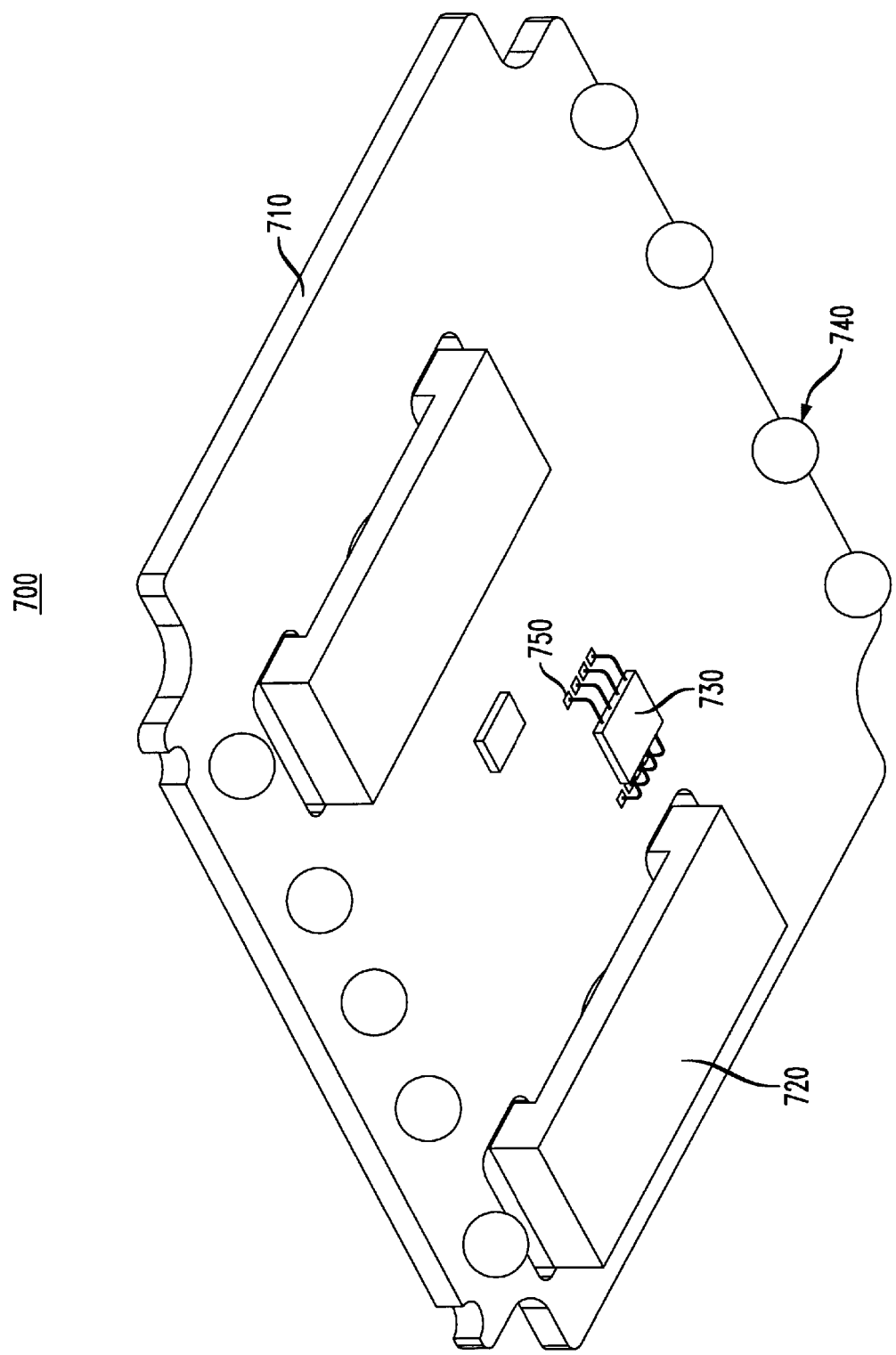
FIG. 7 illustrates an isometric view of another embodiment of a power supply constructed in accordance with the principles of the present invention.

Turning now to FIG. 7, illustrated is an isometric view of another embodiment of a power supply 700 constructed in accordance with the principles of the present invention. The power supply 700 employs an open frame design and includes a substrate 710 (e.g., FR4) having opposing upper and lower conductive layers. The substrate 710 further has a number of vias located therethrough that provide an interconnection between the upper and lower conductive layers.

The power supply 700 further includes a magnetic device 720 (e.g., a planar magnetic device) mounted on the substrate 710. The planar magnetic device 720 may be a transformer, an inductor or a combination thereof having windings formed from a portion of the conductive traces on the upper and lower layers of the substrate 710 and a core disposed through apertures of the substrate 710 and proximate the windings. Planar magnetic devices are described in the '557 and '183 applications and in the '828 patent. The power supply 700 further includes a number of electrical components (not shown) having leads mounted on pads formed on the upper conductive layer. The power supply 700 further includes a number of electrical components (one of which is designated 730) having leads mounted on pads (one of which is designated 750) formed on the lower conductive layer. The electrical components 730 are mounted on the substrate 710 using a standard tin/lead solder composition, located proximate the leads of the electrical components. The solder will transition to a liquid state as the power supply 700 is brought to a reflow temperature, subjecting the electrical components 730 to forces capable of detaching the electrical components 730 from the substrate 710.

Like the power supply 400 of FIG. 4, the power supply 700 advantageously places small components on the lower conductive layer. The small components have a sufficiently low weight such that a surface tension of the solder is sufficient to maintain the components in contact with the lower conductive layer as the solder is subjected to a temperature sufficient to transition it to the liquid state during the reflow soldering process. The present invention primarily places components that are too large to be held in place by the surface tension of the solder on the upper conductive layer. The power supply 700, therefore, can be directly reflow soldered along with other surface mount components on an end user's circuit card. The present invention thus avoids the use of glue or other mechanical fasteners to ensure that the components remain in place during the reflow soldering process. The present invention further avoids the use of high temperature lead-free solder and the disadvantages associated therewith.

The power supply 700 further includes a number of inter-substrate conductive mounts (one of which is designated 740) coupled to the lower conductive layer. The conductive mounts 740 are adapted to mount the power supply 700 to an end user's circuit card (or an adjacent substrate) and provide a conductive path therebetween. The conductive mounts 740 are composed of a material having a melting point above the solder reflow temperature. In the illustrated embodiment, the conductive mounts 740 are hollow copper balls that are plated with tin/lead and are approximately 125 mil in diameter. The copper balls illustrated are manufactured by Ball Chain Manufacturing Co. of Mount Vernon, N.Y. and by Bead Industries of Bridgeport, Conn. Those skilled in the art realize that, while the illustrated embodiment employs copper balls, the use of other conductive mounts composed of a material having a melting point above the solder reflow temperature is well within the broad scope of the present invention. In the '848 patent, Law, et al. describes a slotted, hollow, rectangular parallelepiped mount that may be employed to advantage with the principles of the present invention. Alternatively, the conductive mounts may be solid ball composed of high temperature lead-free solder.

Turning now to FIG. 8, illustrated is a side cut away view of the power supply 700 of FIG. 7. The power supply 700 is mounted to an end user's circuit card 810 using the copper balls as conductive mounts 740. Since the power supply 700 is designed to be surface mounted on the end user's circuit card 810 using a reflow soldering process, small components 730 are mounted on the lower conductive layer of the substrate 710 while larger components 770 are advantageously mounted on the upper conductive layer. The small components 730 may thus be maintained in contact with the lower conductive layer by a surface tension of the solder as the power supply 700 is subjected to the reflow soldering process.

In the illustrated embodiment, the substrate 710 has a number of circular vias (one of which is designated 820) located therethrough that provide an interconnection between the upper and lower conductive layers. Of course, the vias 820 need not be circular. The conductive mounts 740 may, preferably, be surface mounted to the substrate 710 at the vias 820. The geometric simplicity of the copper balls advantageously allows the conductive mounts 740 to be placed on the vias 820 in any orientation, the vias 820 assisting in centering or locating the conductive mounts 740 thereon. As the conductive mounts 740 are mounted to the substrate 710 of the power supply 700 by a reflow soldering process, solder may substantially fill the vias 820, providing a low impedance path through each via 820. Since the conductive mounts 740 may carry a large amount of current, the low impedance path created by the solder within the via 820 and proximate the conductive mount 740 reduces a resistive loss experienced by the power supply 700. While the illustrated embodiment advantageously employs the vias 820 to improve the efficiency of the power supply 700, other embodiments not employing the vias 820 are well within the scope of the present invention.

In any surface mount application, it is desirable to use automated equipment to pick-and-place a surface mount component. This is particularly true with a large subassembly such as the open frame power supply 700 of FIG. 7. To enable a component or subassembly to be used with pick-and-place equipment, a designer should provide a substantially flat surface that is compatible with a vacuum pick-up head of the pick-and-place equipment. More specifically, the substantially flat surface should preferably be located in the center of mass of the subassembly to properly balance the subassembly during the pick-and-place process. One way to provide the substantially flat surface is to leave an open spot (unpopulated with components) on the substrate 710 at the center of mass of the subassembly. The open spot should have sufficient clearance to accommodate the vacuum pick-up head. Leaving an open spot, however, is not conducive to improving power density. Another way to provide the substantially flat surface while improving the power density of the power supply 700 is to locate a sufficiently large component (e.g., power transistor 770) at the center of mass of the power supply 700. Since the large component 770 is placed on the substrate 710 using pick-and-place equipment, a top surface of the large component 770 is compatible with the vacuum pick-up head and may thus be employed to provide the substantially flat surface, allowing the subassembly to be compatible with the pick-and-place equipment. Alternatively, a special component whose primary purpose is to provide the substantially flat surface may be incorporated into the subassembly. Of course, other ways of ensuring compatibility with pick-and-place equipment are well within the broad scope of the present invention.

Figure 9A:
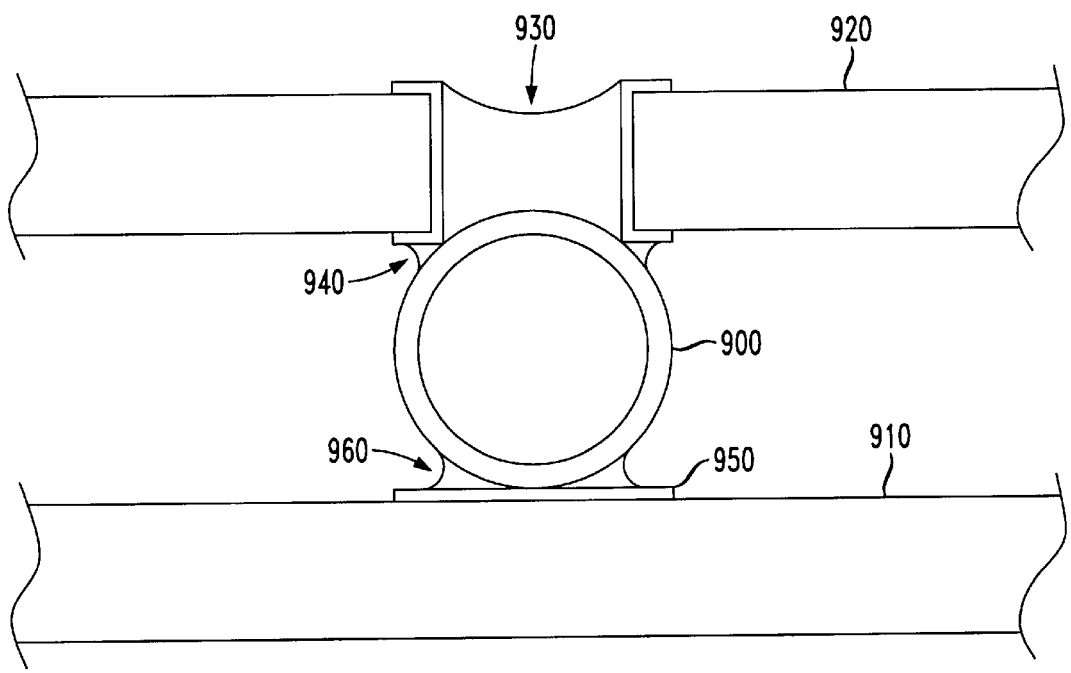
FIGS. 9A and 9B illustrate close up views of alternative embodiments of a conductive mount constructed in accordance with the principles of the present invention.
Figure 9B:
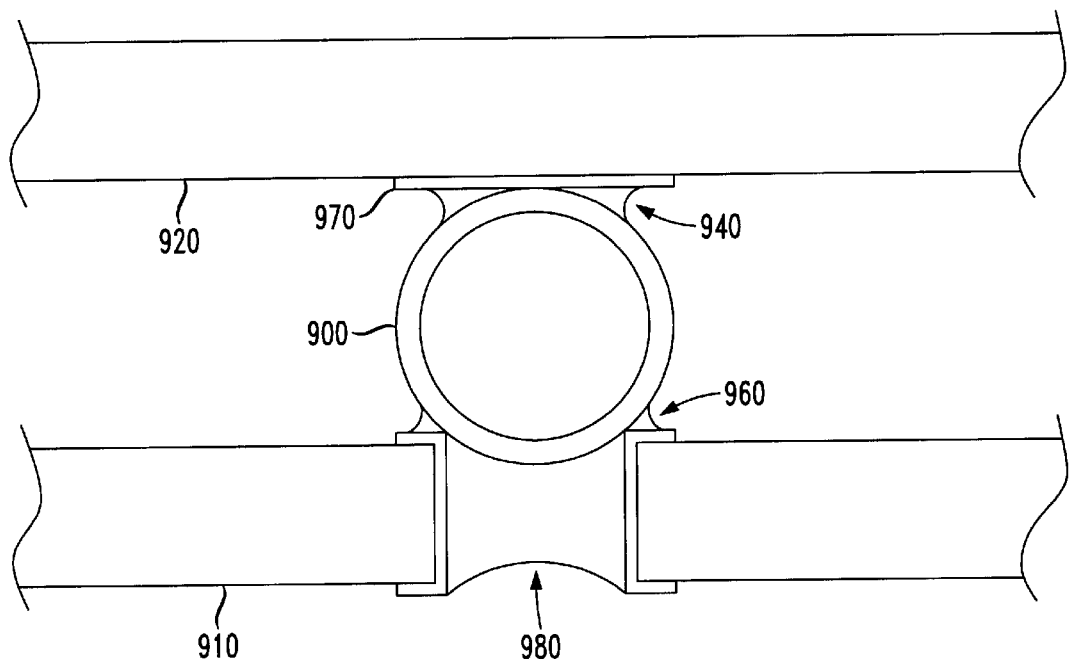

Turning now to FIGS. 9A and 9B, illustrated are close up views of alternative embodiments of a conductive mount 900 constructed in accordance with the principles of the present invention. FIGS. 9A and 9B more clearly detail the conductive mount 900 surface mounted to an end user's circuit card 910. Referring more specifically to FIG. 9A, the substrate 920 has a via 930. The conductive mount 900 is, therefore, surface mounted to the substrate 920 at the via 930 with a first solder fillet 940. The conductive mount 900 is further surface mounted to a pad 950 on the end user's circuit card 910 with a second solder fillet 960.

Turning now to FIG. 9B, the substrate 920 has a solder pad 970 instead of the via 930 of FIG. 9A. The conductive mount 900 is, therefore, surface mounted to the pad 970 with the first solder fillet 940. In the illustrated embodiment, the end user's circuit card 910 has a via or a through-hole mounting hole 980 therein. The conductive mount 900 is, therefore, surface mounted to the via 980 with the second solder fillet 960.

With continuing reference to FIGS. 9A and 9B, the via 930 of the substrate 920 and the via 980 of the end user's circuit card 910 may assist in centering and locating the conductive mount 900. Of course, neither is required by the principles of the present invention.

In the illustrated embodiments, the conductive mount 900 is a copper ball surface mounted to both the substrate 920 and the end user's circuit card 910. The conductive mount 900, therefore, provides first and second compliant solder joints (formed by first and second solder fillets 940,960) at interfaces to the substrate 920 and the end user's circuit card 910, respectively. The first and second compliant solder joints cooperate to improve the co-planarity of the substrate 920 during the reflow soldering process.

As the substrate 920 is reflow soldered to the circuit card 910, a loss of co-planarity may develop between the substrate 920 and the circuit card 910. The substrate 920 and the circuit card 910 are typically multi-layer FR-4 or other epoxy glass material that may soften considerably at reflow temperatures and may therefore be subject to warping in three dimensions, a phenomenon sometimes referred to as "potato chipping." The warping is complex and often unpredictable. Further, the substrate 920 and the circuit card 910 may warp in different directions, causing the conductive mounts 900 to pull away from the substrate 920 or the circuit card 910. The first and second solder fillets 940,960, however, are in a liquid state during the reflow soldering process. The surface tension and capillary action of the solder, therefore, may fill any small gaps between the conductive mount 900 and the substrate 920 or the circuit card 910 caused by the warping, thus maintaining an electrically conductive path between the substrate 920 and the circuit card 910. The first and second compliant solder joints allow the conductive mount 900 to better adapt to the relative displacement between the substrate 920 and the circuit card 910 during the reflow soldering process.

Referring again to FIG. 9A, the substrate 920 has a via 930 therein. While the via 930 is not required by the present invention, the via 930 does provide a number of advantages. During the pick-and-place process, the via 930 provides a cavity for receiving a portion of the conductive mount 900 therewithin. The cavity formed by the via 930 positively locates the position of the conductive mount 900 with respect to the substrate 920, thus improving the accuracy of the pick-and-place equipment. Displacement of the conductive mount 900 is, therefore, less likely to occur. Further, during manufacture, as the substrate 920 is being reflow soldered, the via 930 may be partially or substantially filled with solder. The solder may advantageously form a low resistance connection between the upper and lower conductive layers of the substrate 920. The via 930 further acts as a reservoir for the solder, providing solder to fill the small gaps between the conductive mount 900 and the substrate 920 or the circuit card 910 caused by warping during the reflow soldering process, as the substrate 920 is reflow soldered to the end user's circuit card 910. In the illustrated embodiment, the end user's circuit card 910 has a surface mount pad 930 for receiving the substrate 920. In the alternative embodiment, illustrated and described with respect to FIG. 9B, the end user's circuit card 910 has a via 980 in place of the surface mount pad 950 to provide advantages similar to those described with respect to the via 930.

While the conductive mount 900 in the illustrated embodiment is a copper ball and the via 930 is a circular hole through the substrate 920, the conductive mount 900 and via 930 may be of any geometry. For example, the conductive mount may be a hollow or solid cylinder, mounted with its longitudinal axis horizontal to a rectangularly shaped via in the substrate 920. Of course, the present invention encompasses conductive mounts of any substantially spherical, cylindrical or toroidal shape. Alternatively, the conductive mount may have a substantially cubical or rectangular shape. In a preferred embodiment, slots may be provided in the conductive mount to for ease of soldering to the substrate 920.

Figure 10:
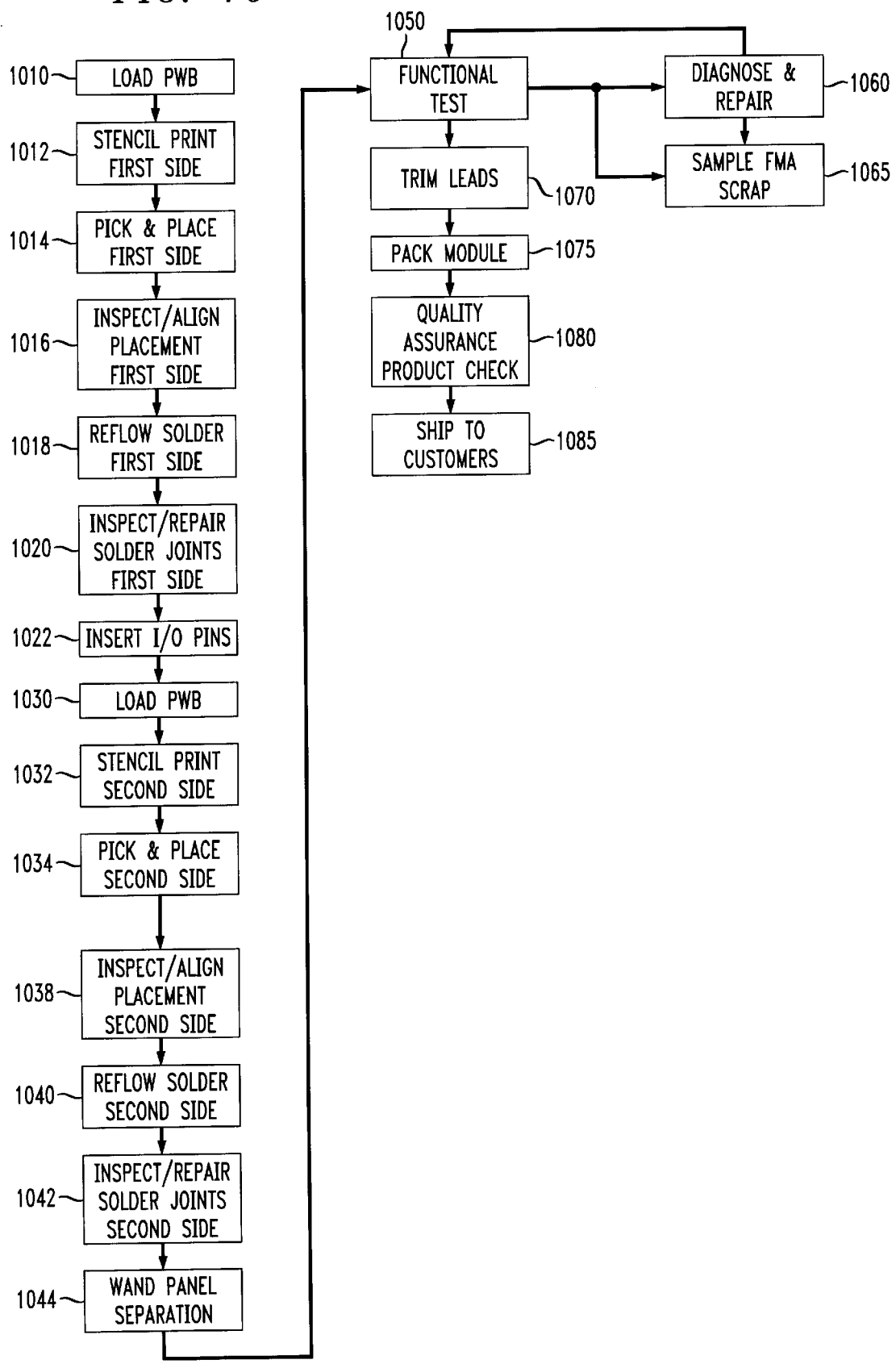
FIG. 10 illustrates a flow diagram of an embodiment of a method of manufacturing a power supply in accordance with the principles of the present invention.

Turning now to FIG. 10, illustrated is a flow diagram of an embodiment of a method of manufacturing a power supply in accordance with the principles of the present invention. The method begins with a Load PWB step 1010 wherein the substrate or printed wiring board (PWB) of the power supply is loaded into the manufacturing equipment. A first side of the substrate is then stencil printed with solder at a Stencil Print First Side step 1012. Then, at a Pick and Place First Side step 1014, small components are picked up by the pick-and-place equipment and placed in the proper position on the substrate. The component placement is then inspected and realigned, if necessary at an Inspect/Align Placement First Side step 1016. The components are then reflow soldered to the first side of the substrate at a Reflow Solder First Side step 1018. After the reflow soldering process, the solder joints are inspected at an Inspect/Repair Solder Joints First Side step 1020. Any solder joints failing inspection are repaired during this step. At this point, the inter-substrate conductive mounts may be mounted to the substrate in an "Insert I/O Pins" step 1022. Alternatively, the inter-substrate conductive mounts may be placed on the substrate during the Pick and Place First Side step 1014 and reflow soldered to the first side of the substrate at the Reflow Solder First Side step 1018.

The substrate is then turned over and loaded into the manufacturing equipment in a second Load PWB step 1030. A second side of the substrate is then stencil printed with solder at a Stencil Print Second Side step 1032. Then, at a Pick and Place Second Side step 1034, larger components are picked up by the pick-and-place equipment and placed in the proper position on the substrate. The component placement is then inspected and realigned, if necessary at an Inspect/Align Placement Second Side step 1038. The components are then reflow soldered to the second side of the substrate at a Reflow Solder Second Side step 1040. After the reflow soldering process, the solder joints are inspected at an Inspect/Repair Solder Joints Second Side step 1042. Any solder joints failing inspection are repaired during this step. The populated substrate may then be separated into individual circuits at a Wand Panel Separation step 1044.

The power supply is then tested at a Functional Test step 1050. Power supplies failing to pass the functional test are repaired at a Diagnose and Repair step 1060 and then sent back to the Functional Test step 1050 for re-testing. If a particular power supply continues to fail after repeated efforts at diagnosis and repair, the power supply may be sent scrapped at a Sample FMA Scrap step 1065.

Once the power supply has passed the functional test, power supplies employing butt cut pins, are passed through a Trim Leads step 1070 wherein the pins forming the inter-substrate conductive mounts are cut to form a co-planar surface suitable for surface mounting on an end user's circuit card. Of course, power supplies employing copper balls for the inter-substrate conductive mounts (as in the power supply illustrated in FIG. 7) need not pass through the Trim Leads step 1070. The power supplies are then packaged in a Pack Module step 1075. An inspector performs a final quality assurance verification in a Quality Assurance Product Check step 1080 and the power supply is then shipped to the customer in a Ship to Customers step 1085, completing the method.

Figure 11:
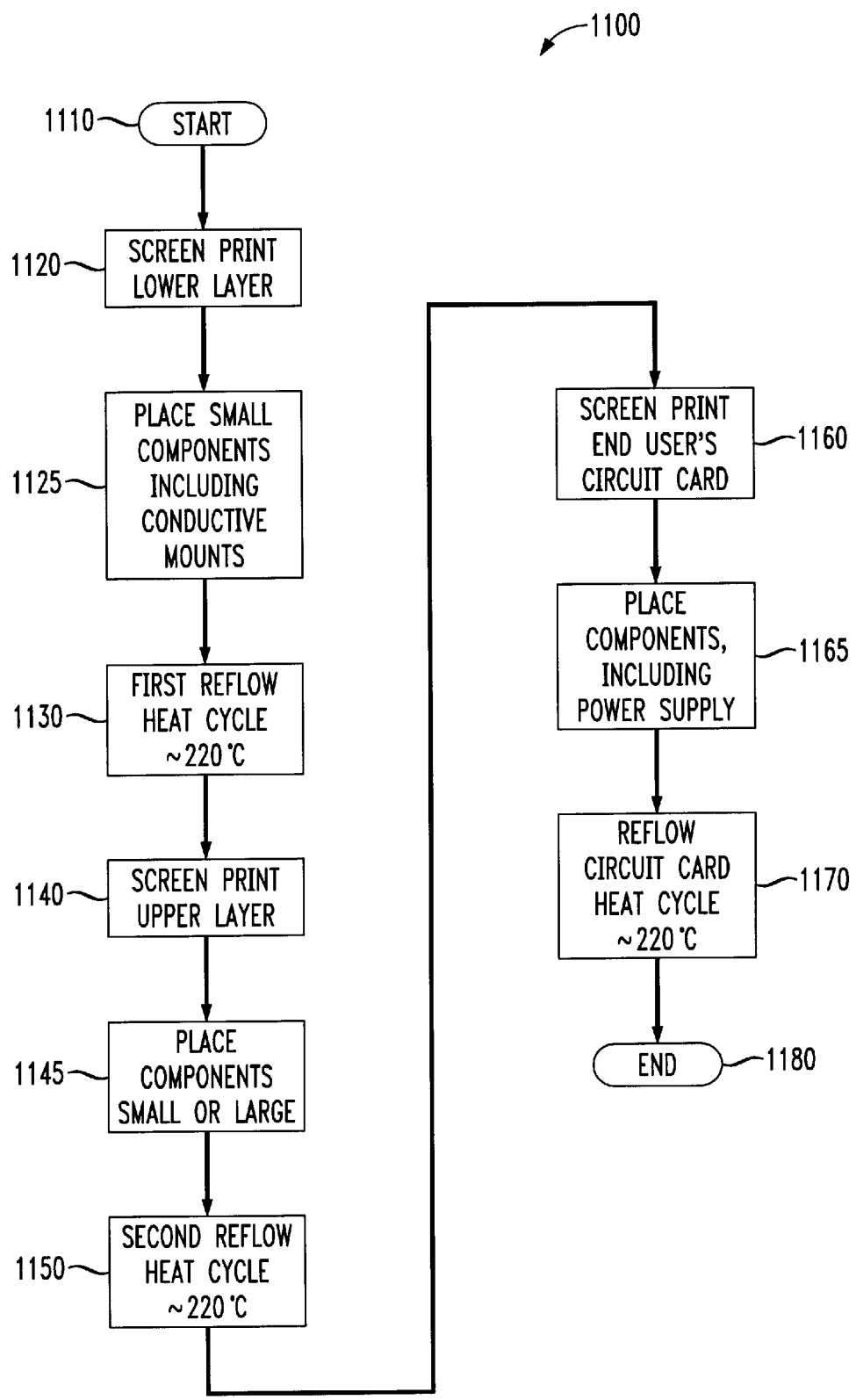
FIG. 11 illustrates a simplified flow diagram of an embodiment of a method of manufacturing a power supply of the present invention and mounting the power supply on an end user's circuit card.

Turning now to FIG. 11, illustrated is a simplified flow diagram of an embodiment of a method of manufacturing a power supply of the present invention and mounting the power supply on an end user's circuit card. The method of manufacturing the power supply is substantially similar to the method illustrated and described with respect to FIG. 10. The method begins at a start step 1110. At a Screen Print Lower Layer step 1120, the lower conductive layer of the substrate is screen printed with solder. Then, at a Place Small Components step 1125, small components are placed on the lower conductive layer of the substrate. In an advantageous embodiment, the Place Small Components step 1125 includes placing the inter-substrate conductive mount on the lower conductive layer of the substrate. While placing the conductive mounts on the substrate at the Place Small Components step 1125 facilitates a smooth and automated manufacturing process, those skilled in the art understand that the conductive mounts may be attached to the substrate at a later step. Then, at a First Reflow step 1130, the power supply is passed through a reflow soldering process.

The power supply is then turned over and the upper conductive layer of the substrate is screen printed with solder at a Screen Print Upper Layer step 1140. Then, at a Place Components step 1145, the remaining components of the power supply, whether small or large, are placed on the upper conductive layer of the substrate. The power supply is then passed through a second reflow soldering process at a Second Reflow step 1150. The power supply is now completed and ready for mounting to the end user's circuit card.

The end user's circuit card is screen printed at a Screen Print Circuit Card step 1160. The power supply is then placed, along with other components, on the circuit card in a Place Components and Power Supply step 1165. Then, at a Reflow Circuit Card step 1170, the end user's circuit card is passed through a reflow soldering process. While the substrate and the end user's circuit card may warp in different directions during the Reflow Circuit Card step 1170, the compliant joints of the inter-substrate conductive mounts cooperate to improve a co-planarity of the power supply with respect to the end user's circuit card. The method then ends at an End step 1180.

Figure 12:
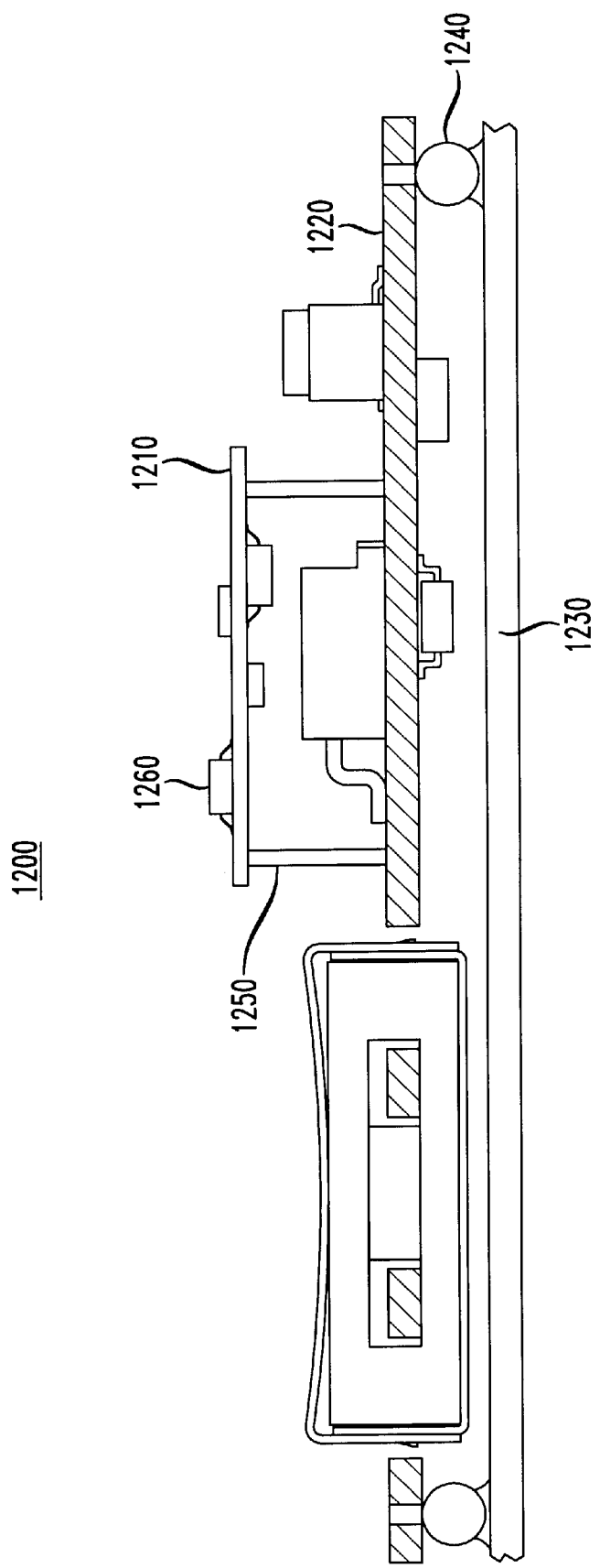
FIG. 12 illustrates a side cut away view of another embodiment of a power supply constructed in accordance with the principles of the present invention.

Turning now to FIG. 12, illustrated is a side cut away view of another embodiment of a power supply 1200 constructed in accordance with the principles of the present invention. With continuing reference to FIG. 7, the power supply 1200 is substantially similar to the power supply 700 of FIG. 7, but adds a second substrate 1210 mounted on the main substrate 1220. The power supply 1200 is surface mountable to an end user's circuit card 1230 using inter-substrate conductive mounts 1240. In the illustrated embodiment, the conductive mounts 1240 are copper balls. Of course, the conductive mounts 1240 may be of any geometry.

Since some complex power supply circuits may require more board real estate than may be available with a single substrate (such as the substrate 710 described with respect to the power supply 700 of FIG. 7), the power supply 1200 advantageously includes an auxiliary substrate 1210. The auxiliary substrate 1210 is surface mounted to the main substrate 1220 using the inter-substrate conductive mounts 1250 of the present invention. In the illustrated embodiment, the conductive mounts 1250 are butt cut pins. Of course, the conductive mounts 1250 may also be copper balls, similar to the conductive mounts 1240 employed to mount the main substrate 1220 to the end user's circuit card 1230.

The auxiliary substrate 1210 provides additional real estate for the constituent components 1260 of the power supply 1200 and may enhance a power density of the power supply 1200. In a preferred embodiment, a material of the auxiliary substrate 1210 is similar to a material of the main substrate 1220 to minimize differences in the thermal coefficients of expansion between the substrate materials.

Power supply modules employing through-hole connections are widely used throughout industry. Often, as previously stated, the power supply module is the only through-hole component on an end user's circuit card, thus requiring a separate through-hole or wave soldering process that would, of course, be unnecessary if the power supply module were surface mountable. The end user, however, may be reluctant to modify the circuit card to accept surface mount power supply modules due to the expense required, particularly in the middle of a production life cycle of the circuit card. It is desirable, therefore, for the surface mount power supply module to have a footprint compatible with the end user's existing circuit card such that the power supply could be reflow soldered to the existing through-hole pads.

Figure 13:
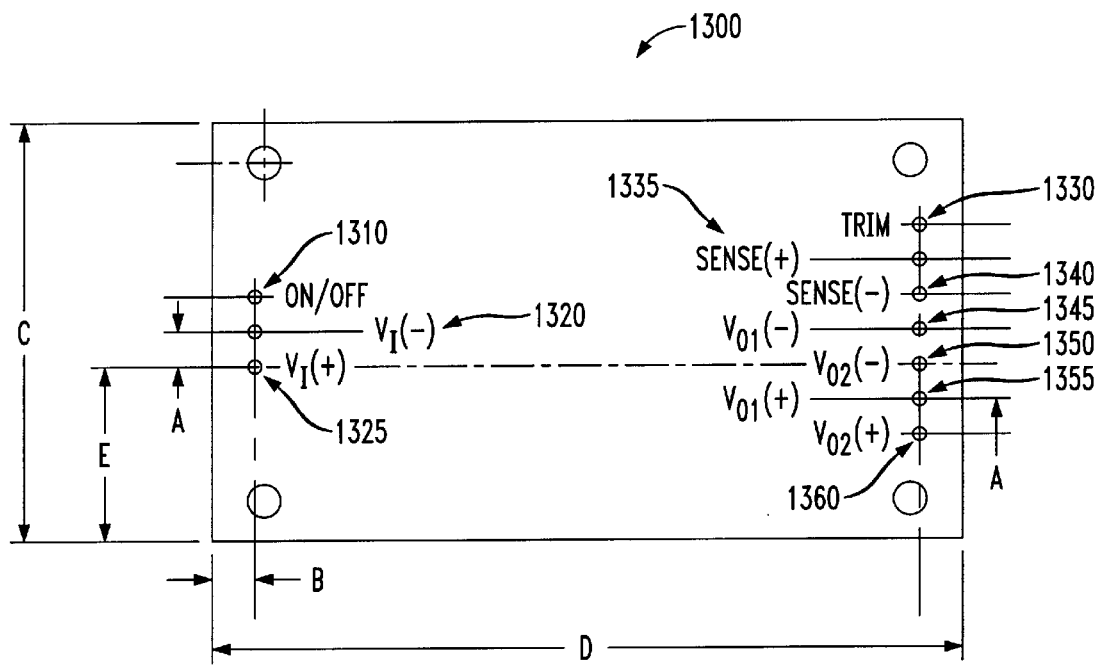
FIG. 13 illustrates a pin-out arrangement of an embodiment of a power supply constructed in accordance with the principles of the present invention.

Turning now to FIG. 13, illustrated is a pin-out arrangement of an embodiment of a power supply 1300 constructed in accordance with the principles of the present invention. The pin-out arrangement includes an ON/OFF pin 1310, a negative input pin $V_I(-)$ 1320 and a positive input pin $V_I(+)$ 1325 arranged linearly on a left side of the power supply 1300. The arrangement further includes a TRIM pin 1330, SENSE(+) and SENSE(−) pins 1335, 1340, first and second negative output pins $V_{O1}(-)$, $V_{O2}(-)$ 1345, 1350 and corresponding first and second positive output pins $V_{O1}(+)$, $V_{O2}(+)$ 1355, 1360 arranged linearly on a right side of the power supply 1300. In the illustrated embodiment, a first spacing A between the centers of the pins on both the left and right sides of the power supply 1300 is approximately 0.2 inches. A second spacing B between the pin centers and an outer edge of the power supply 1300 is approximately 0.1 inches.

The substrate of the power supply 1300 is illustrated as having a width C of approximately 2.35 inches and a length D of approximately 3.3 inches. In the illustrated embodiment, the row of pins on the left side of the power supply 1300 are spaced a third spacing E, approximately 0.975 inches from the outer edge of the power supply 1300. The row of pins on the right side of the power supply 1300 is advantageously lined up with the row of pins on the left side, with the second negative output pin $V_{O1}(-)$ directly opposite the positive input pin $V_I(+)$. Of course, other pin-out arrangements are well within the broad scope of the present invention.

Figure 14:
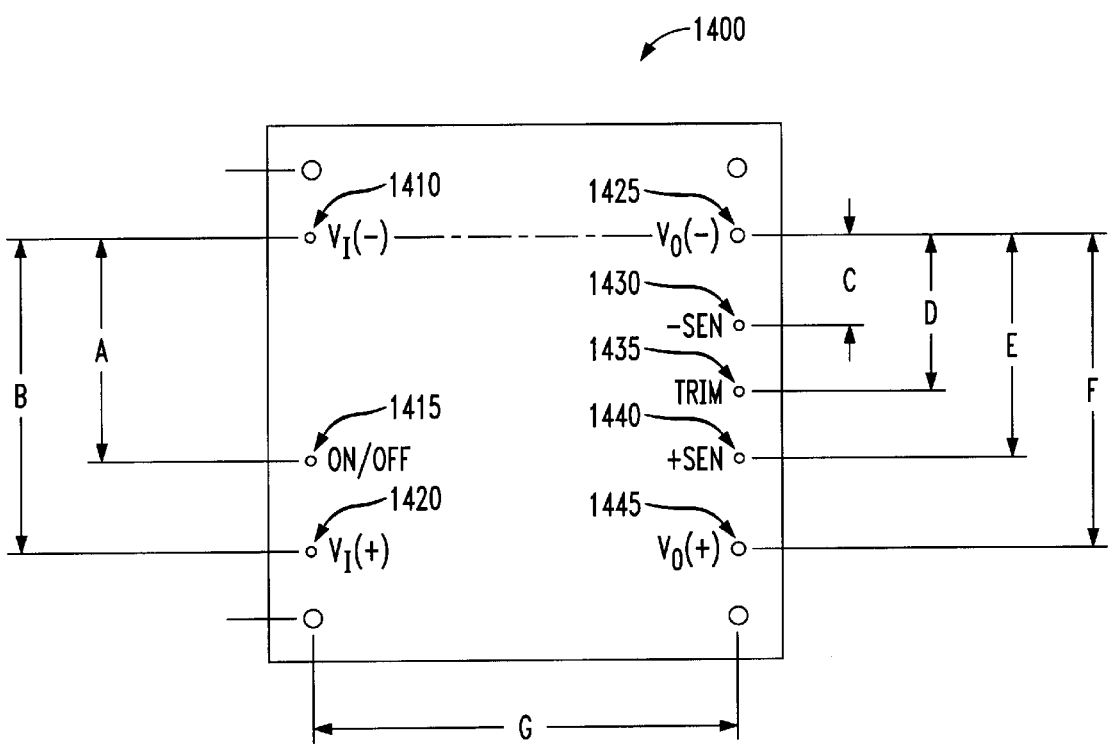
FIG. 14 illustrates a pin-out arrangement of another embodiment of a power supply constructed in accordance with the principles of the present invention.

Turning now to FIG. 14, illustrated is a pin-out arrangement of another embodiment of a power supply 1400 constructed in accordance with the principles of the present invention. The pin-out arrangement includes a negative input pin $V_I(-)$ 1410, an ON/OFF pin 1415 and a positive input pin $V_I(+)$ 1420 arranged on a left side of the power supply 1400. The arrangement further includes a negative output pin $V_O(-)$ 1425, a negative sense pin −SEN 1430, a TRIM pin 1435, a positive sense pin +SEN 1440 and a positive output pin $V_O(+)$ 1445 arranged on a right side of the power supply 1400.

In the illustrated embodiment, a first spacing A between the centers of the negative input pin $V_I(-)$ 1410 and the ON/OFF pin 1415 is approximately 1 inch. A second spacing B between the centers of the negative input pin $V_I(-)$ 1410 and the positive input pin $V_I(+)$ 1420 is approximately 1.4 inches. On the right side of the power supply 1400, third, fourth, fifth and sixth spacings C, D, E, F between the negative output pin $V_O(-)$ 1425 and the negative sense pin SEN(−) 1430, TRIM pin 1435, positive sense pin SEN(+) 1440 and positive output pin $V_O(+)$ 1445, are approximately 0.4, 0.7, 1 and 1.4 inches, respectively. A spacing G between the left and right side pins is approximately 1.9 inches. Of course, other pin-out arrangements are well within the broad scope of the present invention.

The pin-out arrangements of FIGS. 13 and 14 are substantially similar to pin-out arrangements of existing through-hole mounted power supplies. By employing inter-substrate conductive mounts of the appropriate shape and dimension (e.g. the copper ball conductive mounts illustrated and described with respect to the power supply 700 of FIG. 7), the power supply of the present invention may be directly mounted to the mounting holes on the end user's existing circuit board. The circuit board may, therefore, be used with both through-hole power supplies and the surface mount power supply of the present invention.

The surface mountable power supplies of the present invention may advantageously employ a high efficiency power conversion topology to reduce heat dissipation. High efficiency operation of the power supply substantially eases the burden of heat removal, and may allow the power supply to be used in applications wherein a lower efficiency design would be unsuitable. One such high efficiency topology is described by Rozman in U.S. Pat. No. 5,528,482, entitled "Low loss Synchronous Rectifier for Application to Clamped Mode Power Converters," commonly assigned with the present invention and incorporated herein by reference as if reproduced herein in its entirety. There are some applications, however, wherein the heat dissipated by the power supply may be too great for the environmental conditions (e.g., air temperature, airflow) in which the power supply is designed to operate and some assistance in heat removal may be required.

Figure 15:
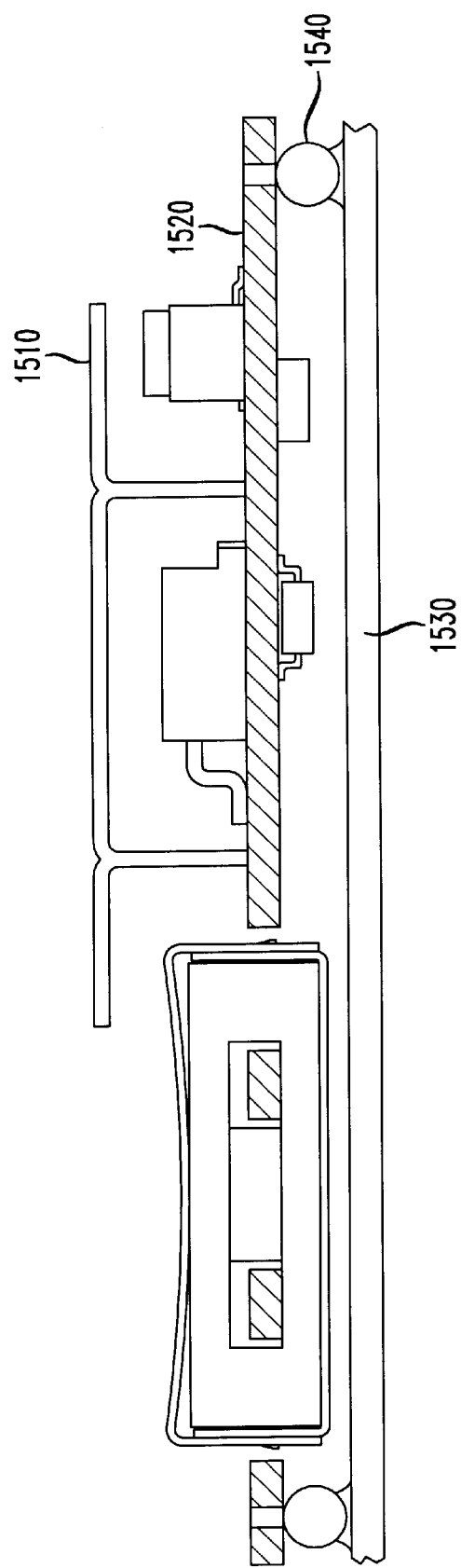
FIG. 15 illustrates a side cut away view of yet another embodiment of a power supply constructed in accordance with the principles of the present invention.

Turning now to FIG. 15, illustrated is a side cut away view of yet another embodiment of a power supply 1500 constructed in accordance with the principles of the present invention. With continuing reference to FIG. 7, the power supply 1500 is substantially similar to the power supply 700 of FIG. 7, but adds a heat sink 1510. The power supply 1500 is surface mountable to an end user's circuit card 1530 using inter-substrate conductive mounts 1540.

In the illustrated embodiment, the power supply 1500 does not contain threaded heat sink mounting mechanisms. The heat sink 1510 is, therefore, surface mounted directly to the substrate 1520. The illustrated heat sink is manufactured by Aavid Thermal Products, Inc. of Concord, N.H. under part numbers 573300 and 573100. Of course, other surface mountable heat sinks are well within the broad scope of the present invention. The heat sink 1510 may be advantageously mounted to the upper conductive layer since the upper conductive layer of the substrate 1520 typically receives a large portion of the usable airflow. Mounting the heat sink on the upper conductive layer is also advantageous in the reflow process, as the heat sink is often too heavy to be held in place by surface tension of the solder alone.

Those skilled in the art should understand that the previously described embodiments of the surface mountable power supply and related methods are submitted for illustrative purposes only and other embodiments thereof capable of surviving reflow are well within the broad scope of the present invention. Additionally, exemplary embodiments of the present invention have been illustrated with reference to specific electronic components. Those skilled in the art are aware, however, that components may be substituted (not necessarily with components of the same type) to create desired conditions or accomplish desired results. For instance, multiple components may be substituted for a single component and vice-versa. For a better understanding of a variety of power converter topologies employing discrete and integrated magnetic techniques, see *Modern DC-to-DC Switchmode Power Converter Circuits,* by Rudolph P. Severns and Gordon Bloom, Van Nostrand Reinhold Company, New York, N.Y. (1985); and *Principles of Power Electronics,* by John G. Kassakian, Martin F. Schlect and George C. Verghese, Addison-Wesley Publishing Company, Reading, Mass. (1991). The above-listed references are incorporated herein by reference in their entirety.

Although the present invention has been described in detail, those skilled in the art should understand that they can make various changes, substitutions and alterations herein without departing from the spirit and scope of the invention in its broadest form.

What is claimed is:

1. A method of manufacturing a surface mountable power supply, comprising:

providing a substrate having opposing upper and lower conductive layers, a portion of conductive traces on said upper and lower conductive layers forming windings of a planar magnetic device;

mounting a first lead of a lower electrical component on a first pad on said lower conductive layer, said lower electrical component subject to forces capable of detaching said lower electrical component from said substrate when said power supply passes through a reflow soldering process;

coupling an inter-substrate conductive mount to said lower conductive layer, said conductive mount composed of a material having a melting point above a solder reflow temperature, adapted to mount said power supply to an adjacent substrate and provide a conductive path therebetween and including first and second compliant solder joints at interfaces of said substrate and said adjacent substrate, respectively;

reflow soldering said lower electrical component and said conductive mount to said lower conductive layer with solder;

placing a second lead of an upper electrical component on a second pad on said upper conductive layer;

further reflow soldering said upper electrical component to said upper conductive layer, said lower electrical component of a sufficiently low weight such that a surface tension of a liquid state of said solder is sufficient to maintain said lower electrical component in contact with said lower conductive layer; and forming a planar magnetic device by arranging a core through apertures of said substrate proximate said windings.

2. The method as recited in claim 1 wherein said substrate is selected from the group consisting of:

an epoxy-glass substrate;

a paper phenolic substrate; and an insulated metal substrate.

3. The method as recited in claim 1 wherein said solder is a tin/lead solder composition, said solder transitioning to a liquid state as said power supply passes through said reflow soldering process.

4. The method as recited in claim 3 wherein said tin/lead solder composition is selected from the group consisting of:

a 60/40 Sn/Pb composition; and a 63/37 Sn/Pb composition.

5. The method as recited in claim 1 wherein said conductive mount is selected from the group consisting of:

a hollow tin/lead plated copper ball;

a solid ball composed of high temperature solder; and a solid metal ball.

6. The method as recited in claim 1 wherein said conductive mount is of a sufficiently low weight such that a surface tension of said liquid state of said solder is sufficient to maintain said conductive mount in contact with said lower conductive layer as said power supply passes through said reflow soldering process.

7. The method as recited in claim 1 further comprising surface mounting an auxiliary substrate to said substrate.

8. The method as recited in claim 7 wherein a material of said auxiliary substrate is substantially similar to a material of said substrate.

9. The method as recited in claim 1 further comprising surface mounting a heat sink to said upper conductive layer.

10. The method as recited in claim 1 wherein said inter-substrate conductive mount is compatible with a through-hole mounting hole on said adjacent substrate.

11. The method as recited in claim 1 wherein said coupling comprises further coupling a plurality of inter-substrate conductive mounts to said lower conductive layer.

* * * * *